(12) United States Patent
Lee et al.

(10) Patent No.: US 12,075,665 B2
(45) Date of Patent: Aug. 27, 2024

(54) DISPLAY DEVICE

(71) Applicant: Samsung Display Co., Ltd., Yongin-Si (KR)

(72) Inventors: Kyoung Won Lee, Seoul (KR); Eun Hye Ko, Yongin-si (KR); Yeon Hong Kim, Hwaseong-si (KR); Eun Hyun Kim, Suwon-si (KR); Sun Hee Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 260 days.

(21) Appl. No.: 17/343,817

(22) Filed: Jun. 10, 2021

(65) Prior Publication Data
US 2022/0140032 A1 May 5, 2022

(30) Foreign Application Priority Data
Nov. 4, 2020 (KR) .................. 10-2020-0146270

(51) Int. Cl.
*H01L 27/32* (2006.01)
*H01L 51/56* (2006.01)
(Continued)

(52) U.S. Cl.
CPC ....... *H10K 59/131* (2023.02); *H10K 59/1201* (2023.02); *H10K 59/1213* (2023.02);
(Continued)

(58) Field of Classification Search
CPC .............. H10K 59/131; H10K 2102/351
See application file for complete search history.

(56) References Cited

U.S. PATENT DOCUMENTS

| 8,415,666 B2 * | 4/2013 | Huh ............ H01L 29/66765 |
| | | 257/E29.294 |
| 2009/0302318 A1 * | 12/2009 | Chang .......... G02F 1/133555 |
| | | 257/59 |

(Continued)

FOREIGN PATENT DOCUMENTS

| KR | 10-2013-0074980 A | * | 7/2013 | ........... H01L 21/336 |
| KR | 10-2015-0011868 A | * | 2/2015 | ............. H05B 33/10 |

(Continued)

OTHER PUBLICATIONS

Machine translation, Kim, Korean Pat. Pub. No. KR20170076184A, translation date: Apr. 19, 2023, Espacenet, all pages. (Year: 2023).*

(Continued)

*Primary Examiner* — Victoria K. Hall
(74) *Attorney, Agent, or Firm* — Innovation Counsel LLP

(57) ABSTRACT

A display device according to an embodiment includes: a first metal layer disposed on a substrate; a first insulating layer disposed on the first metal layer; a first transistor disposed on the first insulating layer and including a semiconductor layer; and a light-emitting device electrically connected to the first transistor, wherein the first metal layer includes a first portion with a first thickness and a second portion with a second thickness, the second thickness is greater than the first thickness, and the semiconductor layer is electrically connected to the first metal layer.

19 Claims, 20 Drawing Sheets

(51) Int. Cl.
*H10K 59/12* (2023.01)
*H10K 59/121* (2023.01)
*H10K 59/124* (2023.01)
*H10K 59/131* (2023.01)
*H10K 71/00* (2023.01)
*H10K 102/00* (2023.01)

(52) U.S. Cl.
CPC ........... *H10K 59/124* (2023.02); *H10K 71/00* (2023.02); *H10K 2102/351* (2023.02)

(56) References Cited

U.S. PATENT DOCUMENTS

| 2013/0119388 | A1* | 5/2013 | Lee | H10K 59/124 438/34 |
| 2016/0111484 | A1* | 4/2016 | An | G09G 3/3266 438/155 |
| 2019/0096925 | A1* | 3/2019 | Lee | H01L 27/124 |

FOREIGN PATENT DOCUMENTS

| KR | 10-2017-0076184 A | * | 7/2017 | ........... G02F 1/1333 |
| KR | 10-2017-0076184 A | | 7/2017 | |
| KR | 10-1770969 B1 | | 8/2017 | |
| KR | 10-1901251 B1 | | 9/2018 | |
| KR | 10-2019-0128040 A | | 11/2019 | |
| KR | 10-2082366 B1 | | 2/2020 | |

OTHER PUBLICATIONS

Machine translation, Song, Korean Pat. Pub. No. KR20130074980A, translation date: Apr. 19, 2023, Espacenet, all pages. (Year: 2023).*
Machine translation, Park, Korean Pat. Pub. No. KR20150011868A, translation date: Apr. 19, 2023, Espacenet, all pages. (Year: 2023).*
Rongsheng Chen, Wei Zhou, Meng Zhang, Man Wong, Hoi Sing Kwok, "Self-alinged top-gate InGaZnO thin film transistors using SiO2_Al2O3 stack gate dielectric", Journal, Thin Solid Films 548 (2013) 572-575, 4pages, © 2013 Elsevier B.V., Center for Display Research, Department of Electronic and Computer Engineering, Hong Kong University of Science and Technology, Clear Water Bay, Kowloon, Hong Kong.

* cited by examiner

DISPLAY DEVICE

CROSS-REFERENCE TO RELATED APPLICATION

This application claims priority to and the benefit of Korean Patent Application No. 10-2020-0146270 filed in the Korean Intellectual Property Office on Nov. 4, 2020, the entire contents of which are incorporated herein by reference.

BACKGROUND

(a) Field

The present disclosure relates to a display device.

(b) Description of the Related Art

An organic light emitting device includes two electrodes and an organic emission layer disposed between them, and electrons injected from one electrode and holes injected from the other electrode are combined in the organic emission layer to generate excitons. When the excitons change to a ground state from an excited state, they emit light.

The organic light emitting device includes a plurality of pixels each including organic light emitting diode which is a self-light-emitting device and the plurality of pixels respectively include a plurality of transistors and at least one capacitor for driving the organic light emitting diode.

The above information disclosed in this Background section is only for enhancement of understanding of the background of the inventive concept, and therefore it may contain information that does not form the prior art that is already known in this country to a person of ordinary skill in the art.

SUMMARY

The present inventive concept has been made in an effort to provide a display device for simplifying a manufacturing process and improving reliability.

An embodiment of the present inventive concept provides a display device including: a first metal layer disposed on a substrate; a first insulating layer disposed on the first metal layer; a first transistor disposed on the first insulating layer, the first transistor including a semiconductor a first transistor disposed on the first insulating layer, the first transistor including a semiconductor layer; and a light-emitting device electrically connected to the first transistor, wherein the first metal layer includes a first portion with a first thickness and a second portion with a second thickness thicker than the first thickness, and wherein the semiconductor layer is electrically connected to the first metal layer.

The first transistor may further include a semiconductor layer disposed on the first insulating layer, a gate electrode disposed on the semiconductor layer, and a drain electrode disposed on the gate electrode.

The display device may further include a second insulating layer disposed between the semiconductor layer and the gate electrode, and a third insulating layer disposed between the gate electrode and the source electrode and between the gate electrode and the drain electrode.

The semiconductor layer may include a first region electrically connected to the source electrode and a second region electrically connected to the drain electrode, and the third insulating layer may include a first contact hole exposing the first region and a second contact hole exposing the second portion of the first metal layer.

The second contact hole may extend to the first insulating layer.

The source electrode may be connected to the first region through the first contact hole and may be connected to a second portion of the first metal layer through the second contact hole.

The first insulating layer may include a first portion overlapping the first portion of the first metal layer and a second portion overlapping the second portion of the first metal layer, and the second portion of the first insulating layer may be thinner than the first portion of the first insulating layer.

The display device may further include a second transistor and a third transistor electrically connected to the first transistor.

Edges of the second insulating layer and the gate electrode may be aligned.

A thickness of the semiconductor layer may be about 300 angstroms to about 500 angstroms.

A thickness of the first insulating layer may be about 2000 angstroms to about 4000 angstroms.

Another embodiment of the present inventive concept provides a method for manufacturing a display device, including: forming a first metal material layer on a substrate; forming a first metal layer including a first portion and a second portion with different thicknesses by etching the first metal material layer using a halftone mask; forming a first insulating material layer on the first metal layer; removing a protruding part of the first insulating material layer by using a polishing process; forming a semiconductor layer, a second insulating layer, and a gate electrode on the first insulating material layer; forming a third insulating material layer on the gate electrode; forming a third insulating layer having a first through hole exposing the semiconductor layer and a second through hole exposing the second portion of the first metal layer by using a mask; and forming a source electrode and a drain electrode on the third insulating layer.

The second portion of the first metal layer may be formed to be thicker than the first portion of the first metal layer.

The first insulating material layer overlapping the second portion of the first metal layer may have a protrusion, and an upper side of the second portion of the first metal layer may be covered by the first insulating material layer in a process for removing the protrusion.

Edges of the second insulating layer and the gate electrode may be formed to be aligned with each other.

The semiconductor layer may include a first region, a second region, and a channel disposed between the first region and the second region, wherein the forming of a third insulating layer may include forming a first contact hole for exposing the second region of the semiconductor layer and forming a second contact hole for exposing the second portion of the first metal layer, and wherein the first contact hole and the second contact hole may be formed in a same process.

The second contact hole may be formed in the third insulating layer and the first insulating layer.

A height difference between the first contact hole and the second contact hole may be about 300 angstroms to about 500 angstroms.

The second portion of the first metal layer may overlap the second contact hole.

The source electrode may be connected to the first region through the first contact hole and may be connected to the second portion of the first metal layer through the second contact hole.

According to the embodiments, the contact hole is formed by using one mask, thereby simplifying the manufacturing process. Further, the transistor with improved reliability by preventing over-etching of the upper side of the semiconductor layer, and the display device including the same, may be provided.

DETAILED DESCRIPTION OF THE EMBODIMENTS

Figure 1:
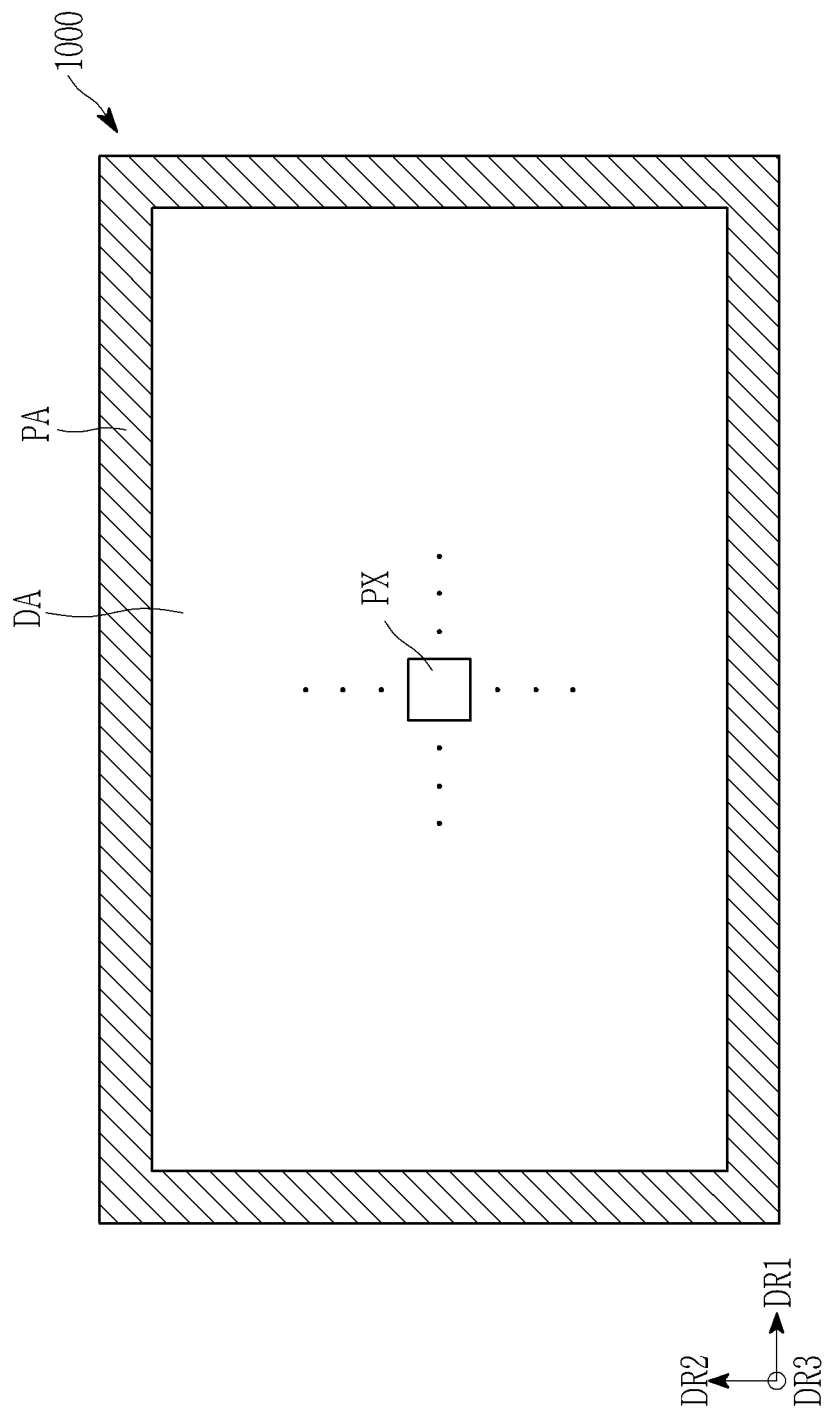
FIG. 1 shows a top plan view of a display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive, and like reference numerals designate like elements throughout the specification.

The size and thickness of each component shown in the drawings are arbitrarily shown for better understanding and ease of description, but the present invention is not limited thereto. The thickness of layers, films, panels, regions, etc. are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing the object portion from the top, and the phrase "in a cross-sectional view" means viewing a cross-section of which the object portion is vertically cut from the side.

FIG. 1 shows a top plan view of a display device according to an embodiment.

Referring to FIG. 1, the display device 1000 according to an embodiment may include a display area through which an image is displayed. The display area may be disposed parallel to a plane defined by a first direction DR1 and a second direction DR2. A normal direction of the display area, that is, a thickness direction of the display device 1000, is indicated by a third direction DR3. Front sides (or top sides) and rear sides (or bottom sides) of the respective members are distinguished by the third direction DR3. However, the directions indicated by the first to third directions DR1, DR2, and DR3 are relative concepts and may be changed to other directions.

The display device 1000 may be a flat rigid display device, and without being limited thereto, it may be a flexible display device. The display device 1000 according to an embodiment of the present inventive concept may include an emissive display panel, and it is not specifically limited thereto. For example, the display device 1000 may include an organic light emitting panel or a quantum dot light emitting display panel. An emission layer of the organic light emitting panel may include an organic light emitting material. The emission layer of the quantum dot light emitting display panel may include a quantum dot and a quantum rod. The display device 1000 will now be described as an embodiment including an organic light emitting panel.

As shown in FIG. 1, the display device 1000 includes a display area (DA) for displaying an image and a non-display area (PA) disposed adjacent to the display area (DA). The non-display area (PA) displays no images. The display area (DA) may be a region in which a plurality of pixels PX are disposed. The display area (DA) may, for example, have a rectangular shape and the non-display area (PA) may surround the display area (DA). However, without being limited thereto, the display area (DA) and the non-display area (PA) may have configurations other than described above and may be altered as needed.

Figure 2:
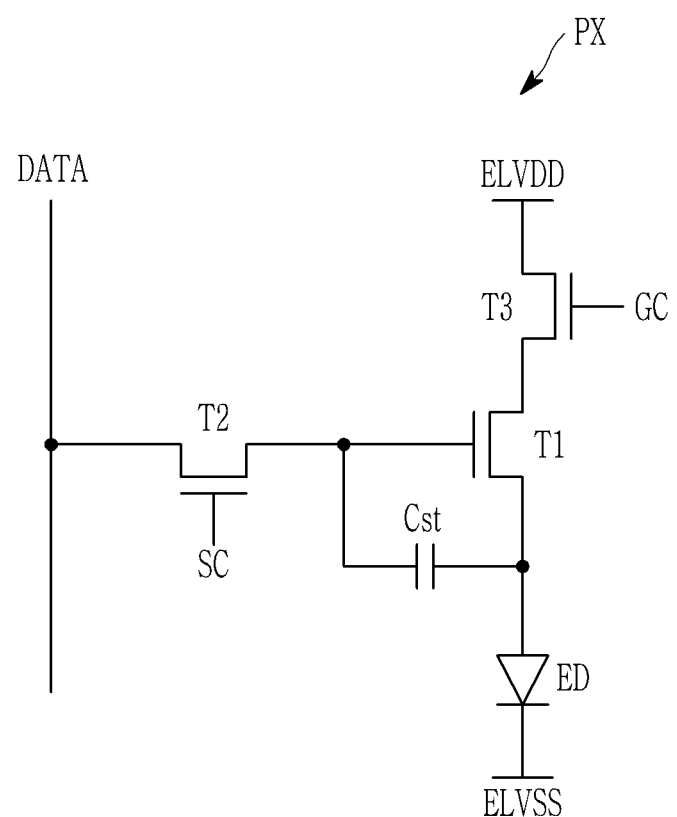
FIG. 2 shows a circuit diagram of a display device according to an embodiment.

FIG. 2 shows a circuit diagram of a pixel of a display device according to an embodiment. The display device according to an embodiment includes a plurality of pixels.

As shown in FIG. 2, one pixel PX may include a plurality of transistors T1, T2, and T3, at least one capacitor Cst, and at least one light emitting diode (ED) that is a light-emitting device.

A plurality of transistors T1, T2, and T3 may include a first transistor T1, a second transistor T2, and a third transistor T3. The first electrode and the second electrode to be described below are given to distinguish two electrodes disposed on respective sides of a channel of the respective transistors T1, T2, and T3, and they may be a source electrode or a drain electrode.

A gate electrode of the first transistor T1 is connected to a first end of the capacitor Cst. A first electrode of the first transistor T1 is connected to a second electrode of the third transistor T3. A second electrode of the first transistor T1 is connected to an anode of the light emitting diode (ED) and a second end of the capacitor Cst. The first transistor T1 may receive a data voltage (DATA) according to a switching operation of the second transistor T2 and may supply a driving current to the light emitting diode (ED) according to a voltage stored in the capacitor Cst.

A gate electrode of the second transistor T2 is connected to a first scan line for transmitting a scan signal (SC). A first electrode of the second transistor T2 is connected to a data line for receiving the data voltage (DATA) or a reference voltage. A second electrode of the second transistor T2 is connected to the first end of the capacitor Cst and the gate electrode of the first transistor T1. The second transistor T2 may be turned in response to the scan signal (SC) to transmit the reference voltage or the data voltage (DATA) to the gate electrode of the first transistor T1 and the first end of the capacitor Cst.

The gate electrode of the third transistor T3 is connected to a global control signal wire for transmitting a global control signal (GC). A first electrode of the third transistor T3 is connected to a driving voltage line for transmitting a driving voltage (ELVDD). A second electrode of the third transistor T3 is connected to the first electrode of the first transistor T1. The third transistor T3 is turned in response to the global control signal to transmit the driving voltage (ELVDD) to the first electrode of the first transistor T1.

The first end of the capacitor Cst is connected to the gate electrode of the first transistor T1 and the second electrode of the second transistor T2. The second end of the capacitor Cst is connected to the second electrode of the first transistor T1 and the anode of the light emitting diode (ED). The cathode of the light emitting diode (ED) is connected to a common voltage line for receiving the common voltage (ELVSS). The light emitting diode (ED) may emit light with luminance according to a driving current generated by the first transistor T1.

When one frame starts, a scan signal (SC) is suppled to turn on the second transistor T2. A data voltage (DATA) provided from the data line is supplied to the gate electrode of the first transistor T1 and the first end of the capacitor Cst through the turned on second transistor T2

In an emission section, the first transistor T1 receives the driving voltage (ELVDD) through the third transistor T3 that is turned on by the global control signal (GC). The first transistor T1 may generate a driving current by the applied driving voltage (ELVDD) and the data voltage (DATA) applied to the gate electrode, the driving current may be transmitted to the light emitting diode (ED), and the light emitting diode (ED) may emit light. In this instance, the global control signal (GC) may be applied to the pixels disposed in the display panel or may be applied to a plurality of pixels disposed in at least one row.

Figure 3A:
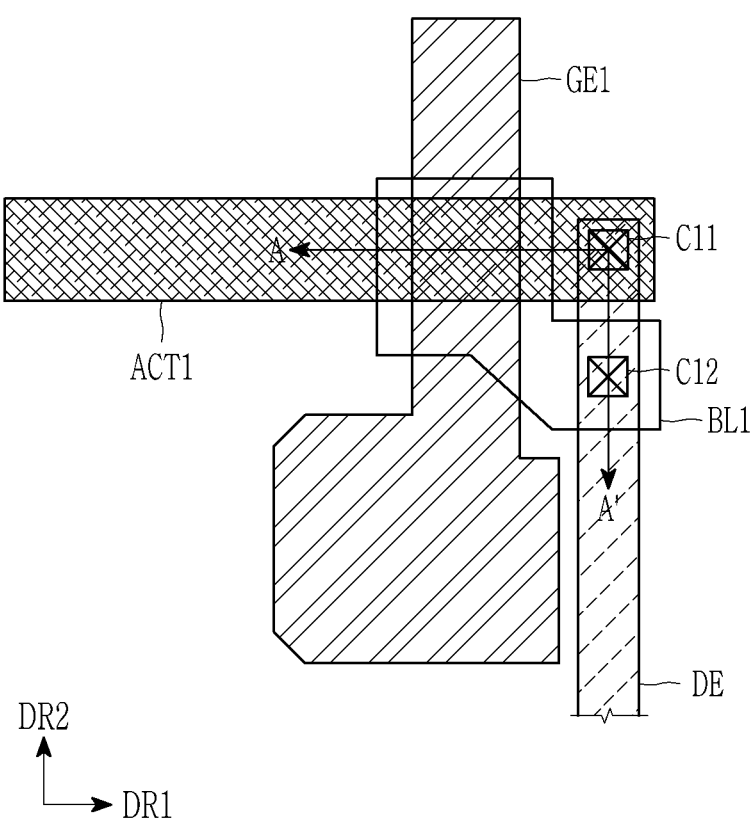
FIG. 3A shows a top plan view of some constituent elements of a first transistor according to an embodiment.

A first transistor according to an embodiment will now be described with reference to FIG. 3A and FIG. 3B. FIG. 3A shows a top plan view of some constituent elements of a first transistor according to an embodiment, and FIG. 3B shows a cross-sectional view with respect to a line A-A' of FIG. 3A.

Figure 3B:
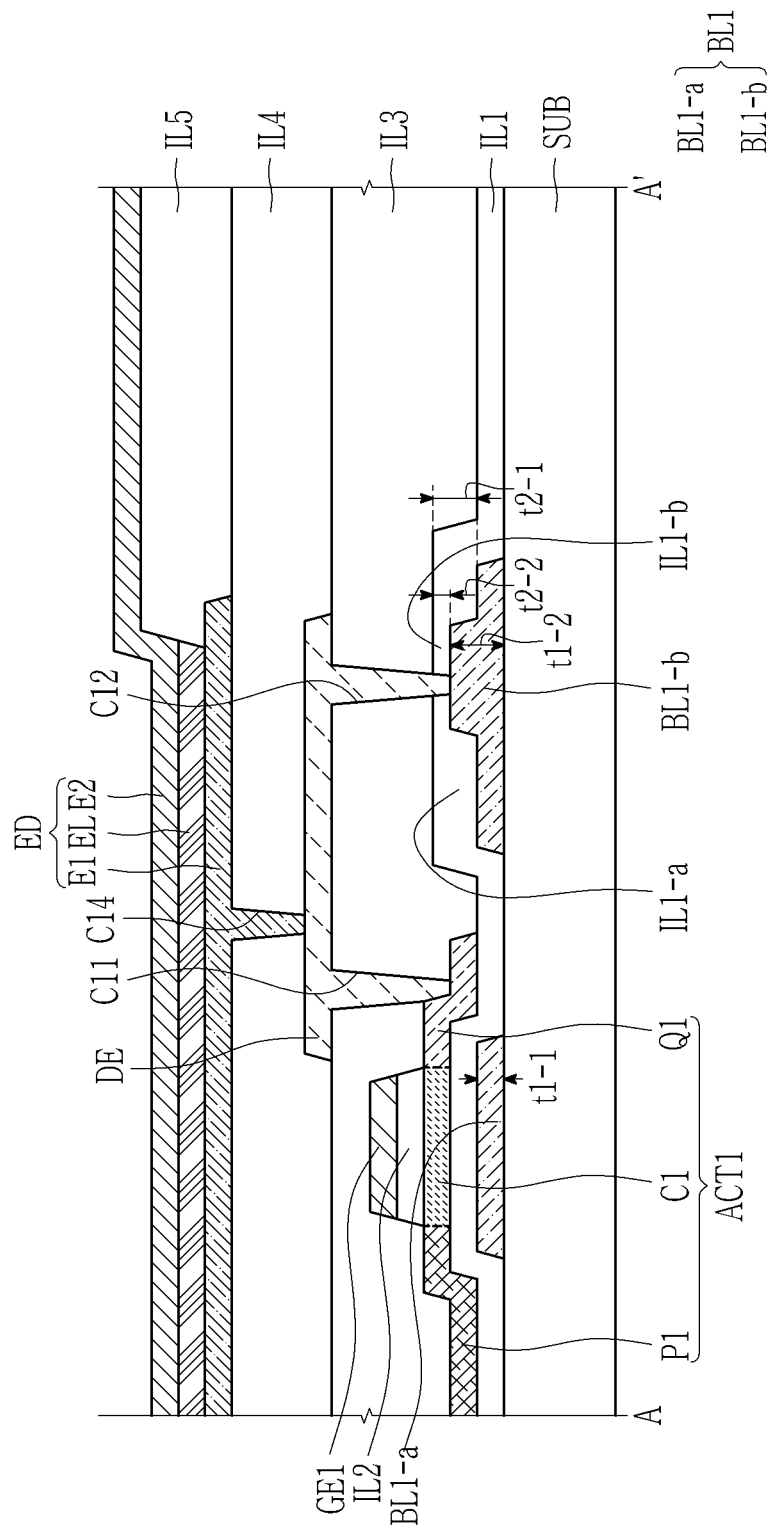
FIG. 3B shows a cross-sectional view with respect to a line A-A' of FIG. 3A.

Referring to FIG. 3A and FIG. 3B, the display device according to an embodiment may include a substrate (SUB). The substrate (SUB) may include an insulating material such as glass or plastic and may have flexibility.

A first metal layer BL1 may be disposed on the substrate (SUB). The first metal layer BL1 may overlap part of the first semiconductor layer ACT1 in a plan view.

The first metal layer BL1 may include a first portion (BL1-*a*) and a second portion (BL1-*b*) with different thicknesses. The second portion (BL1-*b*) may overlap the second contact hole C12 in a plan view. An area of the second portion (BL1-*b*) may be greater than an area of the second contact hole C12 in a plan view.

The first portion (BL1-*a*) may have a first thickness (t1-1), and the second portion (BL1-*b*) may have a second thickness (t1-2). The first thickness (t1-1) may be less than the second thickness (t1-2). The second thickness (t1-2) may be greater than the first thickness (t1-1). The second thickness (t1-2) may be substantially greater than the thickness of the first insulating layer IL1. The thickness difference between the first portion (BL1-*a*) and the second portion (BL1-*b*) may be substantially the same to a thickness of the first semiconductor layer ACT1.

A first insulating layer IL1 may be disposed on the substrate (SUB) and the first metal layer BL1. The first insulating layer IL1 may substantially overlap the front side of the substrate (SUB). The first insulating layer IL1 may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer. A thickness of the first insulating layer IL1 may be about 2000 angstroms to about 4000 angstroms.

The first insulating layer IL1 may include a first portion (IL1-*a*) overlapping the first portion (BL1-*a*) of the first metal layer BL1 and a second portion (IL1-*b*) overlapping the second portion (BL1-*b*) of the first metal layer BL1. The first portion (IL1-*a*) of the first insulating layer IL1 may have a first thickness t2-1 and the second portion (IL1-*b*) of the first insulating layer IL1 may have a second thickness t2-2 which is thinner than the first thickness t2-1. The second thickness (t2-2) of the first insulating layer IL1 may be very thin and may have a thickness of about several tens to several hundreds of angstroms.

An upper surface of the first portion (IL1-*a*) and an upper surface of the second portion (IL1-*b*) of the first insulating layer IL1 may form a substantially planar surface. The upper surfaces of the first portion (IL1-*a*) and the second portion (IL1-*b*) of the first insulating layer IL1 may have an uneven surface on the first metal layer BL1.

A first semiconductor layer ACT1 including a channel C1 of the first transistor, a first region P1, and a second region Q1 may be disposed on the first insulating layer IL1. A channel C1 of the first semiconductor layer ACT1 may overlap part of the first metal layer BL1.

A second insulating layer IL2 and a gate electrode GE1 may be disposed on the channel C1 of the first semiconductor layer ACT1.

The second insulating layer IL2 may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer.

The gate electrode GE1 and the second insulating layer IL2 may have edges substantially identical to each other in a plan view. Edges of the gate electrode GE1 and the second insulating layer IL2 may be aligned with each other. However, the edge of the second insulating layer IL2 may completely surround the edge of the gate electrode GE1. The gate electrode GE1 and the second insulating layer IL2 may be formed at the same time using a same mask.

A third insulating layer IL3 may be disposed on the gate electrode GE1, the first semiconductor layer ACT1, and the first insulating layer IL1. The third insulating layer IL3 may substantially overlap the front side of the substrate (SUB).

The third insulating layer IL3 may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer.

A source electrode (not shown) and a drain electrode DE may be disposed on the third insulating layer IL3. The third insulating layer IL3 may include a first contact hole C11 overlapping a second region Q1, and a second contact hole C12 overlapping the second portion of the first metal layer BL1 (BL1-b). The drain electrode DE may be electrically connected to the second region Q1 through the first contact hole C11, and the drain electrode DE may be electrically connected to the second portion of the first metal layer BL1 (BL1-b) through the second contact hole C12. The second portion of the first metal layer BL1 (BL1-b) may be electrically connected to the second region Q1 through the drain electrode DE.

The first contact hole C11 may be formed in the third insulating layer IL3. The second contact hole C12 may be formed in the third insulating layer IL3 and the first insulating layer IL1. Particularly, the second contact hole C12 may be formed in the second portion (IL1-b) of the first insulating layer IL1.

According to an embodiment, a height of the first contact hole C11 may be a thickness of the third insulating layer IL3 disposed on the first semiconductor layer ACT1. A height of the second contact hole C12 may be a sum of the thickness of the third insulating layer IL3 and the thickness of the first insulating layer IL1 disposed on the second portion of the first metal layer BL1 (BL1-b). A height difference between the first contact hole C11 and the second contact hole C12 may be very small because the thickness difference between the first portion (BL1-a) and the second portion (BL1-b) of the first metal layer BL1 is substantially the same to the thickness of the first semiconductor layer ACT1. The thickness of the semiconductor layer ACT1 is about 300 angstroms to about 500 angstroms and the second portion (IL1-b) of the first insulating layer IL1 overlapping the second portion (BL1-b) may be very thin and may gave a thickness of several tens to several hundreds of angstroms.

According to an embodiment, because the first contact hole C11 and the second contact hole C12 may be formed using one mask exposing the first contact hole C11 and the second contact hole C12, etching times for forming the first contact hole C11 and the second contact hole C12 may be substantial the same as each other. Because the height difference between the first contact hole C11 and the second contact hole C12 is reduced by forming the second portion of the first metal layer BL1 (BL1-b) which is thicker than other portions of the first metal layer BL1 and reducing a thickness of the first insulating layer formed on the second portion of the first metal layer BL1 (BL1-b), damage to the semiconductor layer ACT1 may be reduced when forming the first contact hole C11 and the second contact hole C12.

A fourth insulating layer IL4 may be disposed on the source electrode and the drain electrode DE. The fourth insulating layer IL4 may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer.

A first electrode E1 may be disposed on the fourth insulating layer IL4. A fifth insulating layer IL5 may be disposed on at least part of the first electrode E1, and the fourth insulating layer IL4. The fifth insulating layer IL5 may include an organic insulating material such as a polyacryl-based resin or a polyimide-based resin. The fifth insulating layer IL5 may include an opening exposing the first electrode E1.

An emission layer (EL) may be disposed on the fifth insulating layer IL5 and the first electrode E1. The emission layer (EL) may be disposed in the opening of the fifth insulating layer IL5. The emission layer (EL) may include an organic light emitting material or an inorganic light emitting material. The emission layer (EL) is illustrated to be partly formed on the substrate (SUB) but the formation of the emission layer (EL) is not limited thereto. The emission layer (EL) may be disposed to entirely overlap the front side of the substrate (SUB). That is, one emission layer (EL) may be disposed on a plurality of pixels.

A second electrode E2 may be disposed on the emission layer (EL). The second electrode E2 may be entirely formed on the substrate (SUB). That is, one second electrode E2 may be disposed on a plurality of pixels. A common voltage (ELVSS) may be applied to the second electrode E2.

At least one of the first electrode E1 and the second electrode E2 may be made of a transparent metal oxide such as an indium tin oxide (ITO) or an indium zinc oxide (IZO).

The first electrode E1, the emission layer (EL), and the second electrode E2 may constitute a light emitting diode (ED). In this instance, the first electrode E1 may be an anode and the second electrode E2 may be a cathode.

Figure 4:
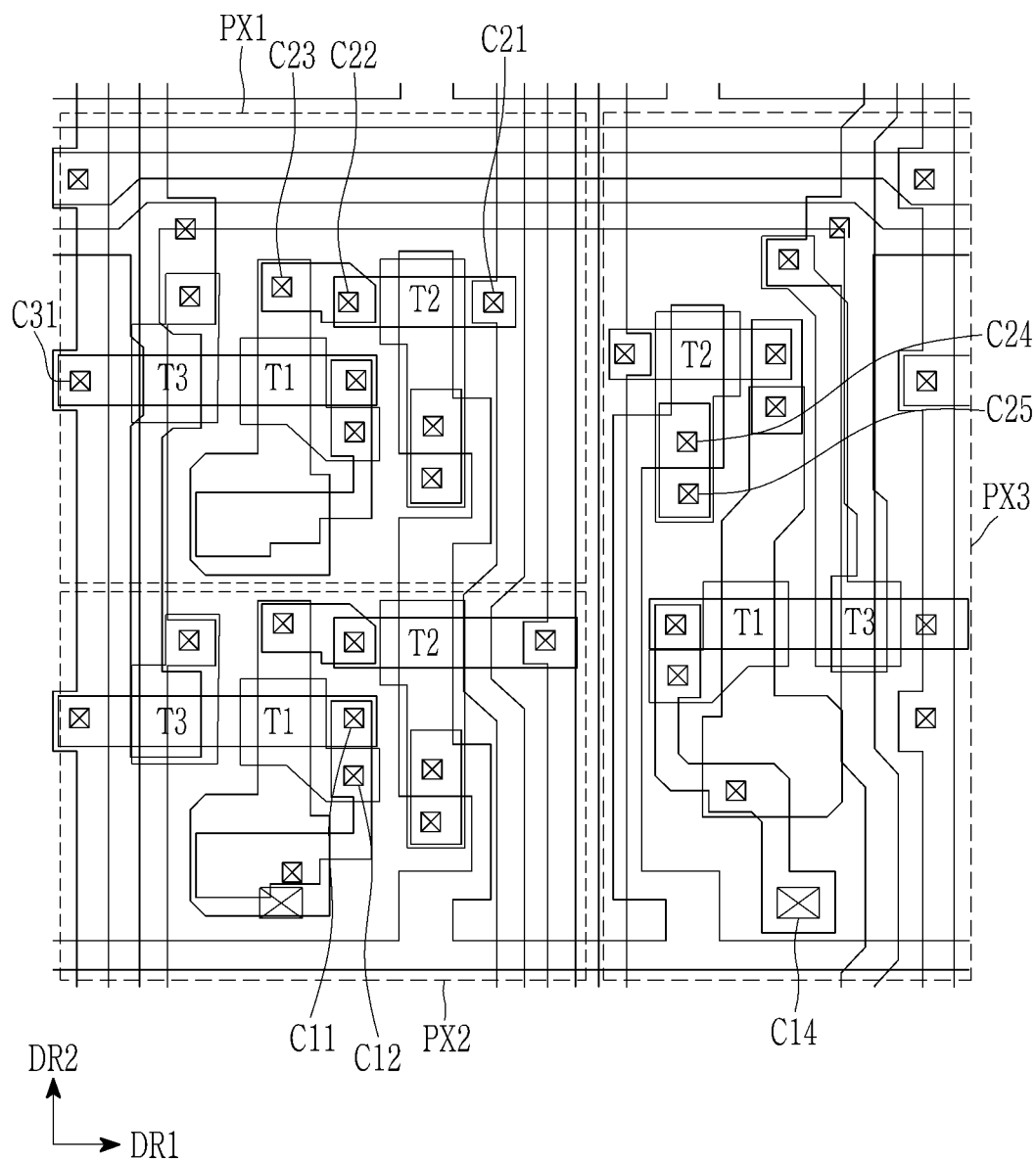
FIG. 4 shows a layout view of a plurality of pixels according to an embodiment.

A plurality of pixels including the first transistor described with reference to FIG. 4 to FIG. 8 will now be described. FIG. 4 shows a layout view of a plurality of pixels according to an embodiment, and FIG. 5, FIG. 6, FIG. 7, and FIG. 8 are respectively a top plan view of constituent elements.

Figure 5:
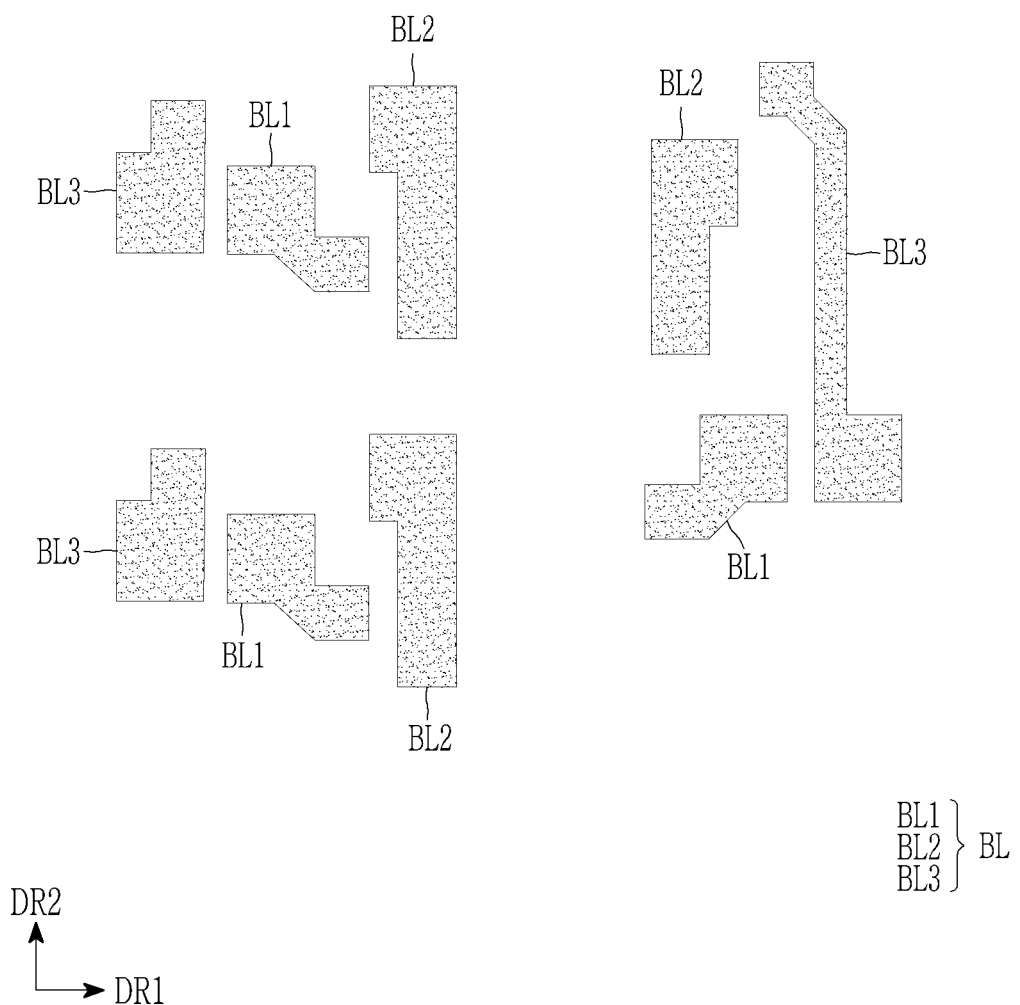
FIG. 5, FIG. 6, FIG. 7, and FIG. 8 are respectively a top plan view of constituent elements.

With reference to FIG. 4 to FIG. 8 together with the stacked structure shown in FIG. 3B and the cross-sectional views of a display panel shown in FIG. 9 to FIG. 13, a first metal material layer ML may be formed on the substrate (SUB) and etched to form a first conductive layer according to an embodiment. The first conductive layer may include a metal layer (BL). The first conductive layer is shown in FIG. 5.

The first to third pixels PX1, PX2, and PX3 may respectively include a metal layer (BL). The metal layer may include a first metal layer BL1 overlapping the first transistor T1, a second metal layer BL2 overlapping the second transistor T2, and a third metal layer BL3 overlapping the third transistor T3.

As described above, the first metal layer BL1 may be electrically connected to the second region Q1 of the first semiconductor layer ACT1 through the contact holes C11 and C12. The second metal layer BL2 may be electrically connected to a second gate electrode GE2 of the second transistor T2 through the contact holes C24 and C25. The third metal layer BL3 may be electrically connected to the global control wire GCL1.

Planar shapes of the metal layers BL1, BL2, and BL3 may be polygonal. The planar shapes of the metal layers BL1, BL2, and BL3 included in the respective pixels PX1, PX2, and PX3 may be the same as or different from each other. In detail, the metal layers (BL) included in the first pixel PX1 and the second pixel PX2 may have the planar shapes that are the same as each other. Further, the planar shapes of the metal layers (BL) included by the second pixel PX2 and the third pixel PX3 may be different from each other.

The first conductive layer may include molybdenum (Mo), aluminum (Al), copper (Cu) silver (Ag), chromium (Cr), tantalum (Ta), and titanium (Ti). The first conductive layer may include a single or multi-layered structure including the above-noted metal. For example, the first conductive layer may include a double-layered structure configured with a layer including titanium and a layer including copper.

A first insulating layer IL1 may be disposed on the substrate (SUB) and the metal layer (BL). The first insulating layer IL1 may substantially cover the front surface of the substrate (SUB).

Figure 6:
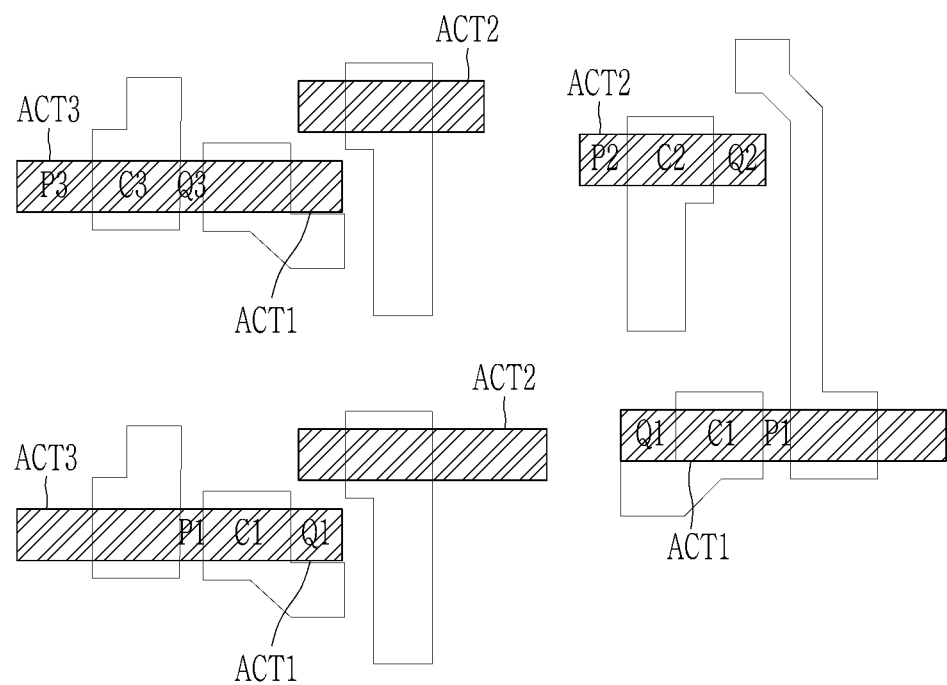
Figure 6:
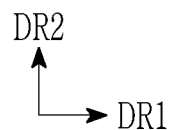

A first semiconductor layer ACT1 including a channel C1, a first region P1, and a second region Q1 of the first transistor T1 of the first to third pixels PX1, PX2, and PX3, a second semiconductor layer ACT2 including a channel C2, a first region P2, and a second region Q2 of the second transistor T2, and a third semiconductor layer ACT3 including a channel C3, a first region P3, and a second region Q3 of the third transistor T3 may be disposed on the first insulating layer IL1. FIG. 6 illustrates a semiconductor layer.

The semiconductor layers ACT1, ACT2, and ACT3 may include a semiconductor material such as amorphous silicon, polysilicon, or an oxide semiconductor. The thicknesses of the first to third semiconductor layers ACT1, ACT2, and ACT3 may be from about 300 to about 500 angstroms.

The channel C1, the first region P1, and the second region Q1 of the first semiconductor layer ACT1 may have bar shapes extending in the first direction DR1. The channel C1 may be disposed between the first region P1 and the second region Q1. The first region P1 of the first transistor T1 may be connected to the second region Q3 of the third transistor T3. The second region Q1 of the first transistor T1 may be electrically connected to a light-emitting device to be described.

The first semiconductor layer ACT1 may overlap the first conductive layer. Particularly, the first metal layer BL1 may overlap the channel C1 of the first semiconductor layer ACT1.

The channel C2, the first region P2, and the second region Q2 of the second semiconductor layer ACT2 may have bar shapes extending in the first direction DR1. The channel C2 may be disposed between the first region P2 and the second region Q2. The first region P2 may be electrically connected to data lines DL1, DL2, and DL3 to be described through the contact hole C21. The first region P2 of the second transistor T2 of the first pixel PX1 may be connected to the first data line DL1. The first region P2 of the second transistor T2 of the second pixel PX2 may be connected to the second data line DL2. The first region P2 of the second transistor T2 of the third pixel PX3 may be connected to the third data line DL3. The second region Q2 of the second transistor T2 may be electrically connected to the gate electrode GE1 of the first transistor T1, and a lower storage electrode (LE).

The channel C3, the first region P3, and the second region Q3 of the third semiconductor layer ACT3 may have bar shapes extending in the first direction DR1. The channel C3 may be disposed between the first region P3 and the second region Q3. The first region P3 may overlap and be electrically connected to the driving voltage lines DVL1 and DVL2 through the contact hole C31. The second region Q3 may be connected to the first region P1 of the first semiconductor layer ACT1. The first semiconductor layer ACT1 and the third semiconductor layer ACT3 may be integrally formed.

A second insulating layer IL2 may be disposed on the semiconductor layers ACT1, ACT2, and ACT3 including the channel C1, the first region P1, and the second region Q1 of the first transistor T1, the channel C2, the first region P2, and the second region Q2 of the second transistor T2, and the channel C3, the first region P3, and the second region Q3 of the third transistor T3.

Figure 7:
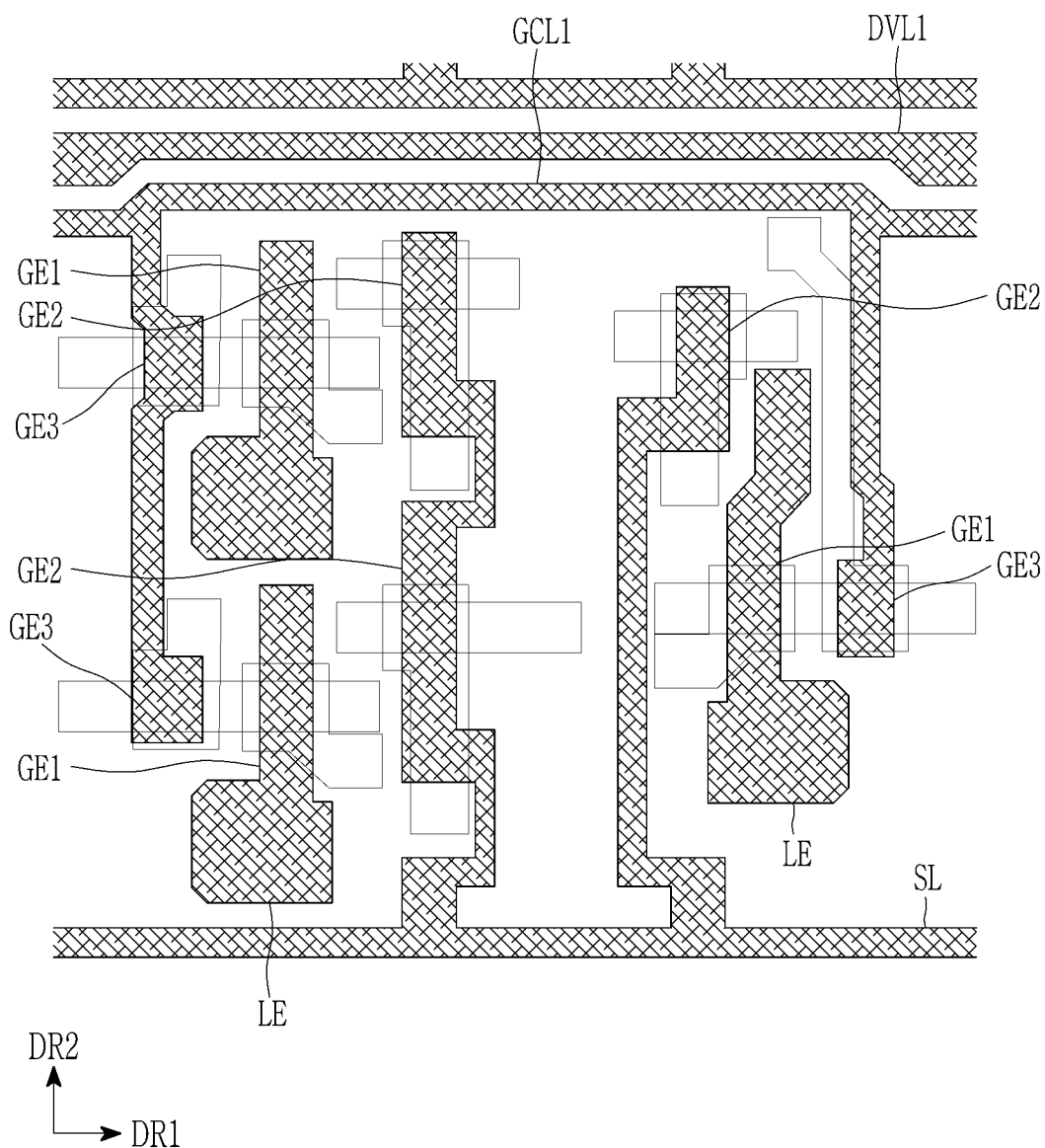

A second conductive layer including the gate electrode GE1 of the first transistor T1, the gate electrode GE2 of the second transistor T2, the gate electrode GE3 of the third transistor T3, and the low storage electrode (LE) of the first to third pixels PX1, PX2, and PX3 may be disposed on the second insulating layer IL2. FIG. 7 illustrates a second conductive layer.

The second conductive layer and the second insulating layer IL2 may be formed at the same time by using a same mask. The edges of the second conductive layer and the second insulating layer IL2 may be substantially aligned. The edge the second insulating layer IL2 may completely surround the edge of the second conductive layer in a plan view.

The gate electrode GE1 of the first transistor T1 may overlap the channel C1 of the first transistor T1. The gate electrode GE1 of the first transistor T1 may be connected to the low storage electrode (LE), and they may be integrally formed. The low storage electrode (LE) may be electrically connected to the second region Q2 of the second transistor T2.

A planar shape of the low storage electrode (LE) may be polygonal. The planar shapes of the low storage electrodes (LE) of the first to third pixels PX1, PX2, and PX3 may be the same as or different from each other.

The gate electrode GE2 of the second transistor T2 may overlap the channel C2 of the second transistor T2. The second gate electrodes GE2 of the second transistors T2 of the first pixel PX1 and the second pixel PX2 may be connected to each other or may be integrally formed. The second gate electrode GE2 of the second transistor T2 of the third pixel PX3 may be separately formed. The second gate electrodes GE2 of the first to third pixels PX1, PX2, and PX3 may be connected to one scan line SL. A same scan signal (SC) may be applied to the second gate electrodes GE2 of the second transistors T2 of the first to third pixels PX1, PX2, and PX3. In this instance, the connected scan line SL may extend in the first direction DR1.

The third gate electrode GE3 of the third transistor T3 may overlap the channel C3 of the third transistor T3. The third gate electrodes GE3 of the third transistors T3 of the first and second pixels PX1 and PX2 may be connected to each other or may be integrally formed. The third gate electrode GE3 of the third transistor T3 of the third pixel PX3 may be separately formed. The third gate electrodes GE3 of the first to third pixels PX1, PX2, and PX3 may be connected to one global control wire GCL1. A same global control signal (GC) may be applied to the third gate electrodes GE3 of the third transistors T3 of the first to third pixels PX1, PX2, and PX3. The global control wire GCL1 may extend in the first direction DR1. In this instance, the gate electrodes GE3 of the third transistors T3 connected to each other may have bar shapes extending in the second direction DR2.

The second conductive layer may further include a driving voltage auxiliary line DVL1. The driving voltage auxiliary line DVL1 may extend in the first direction DR1. The driving voltage auxiliary line DLV1 may be connected to the driving voltage line DVL2 to be described and may lower resistance of the driving voltage line DVL2.

Figure 8:
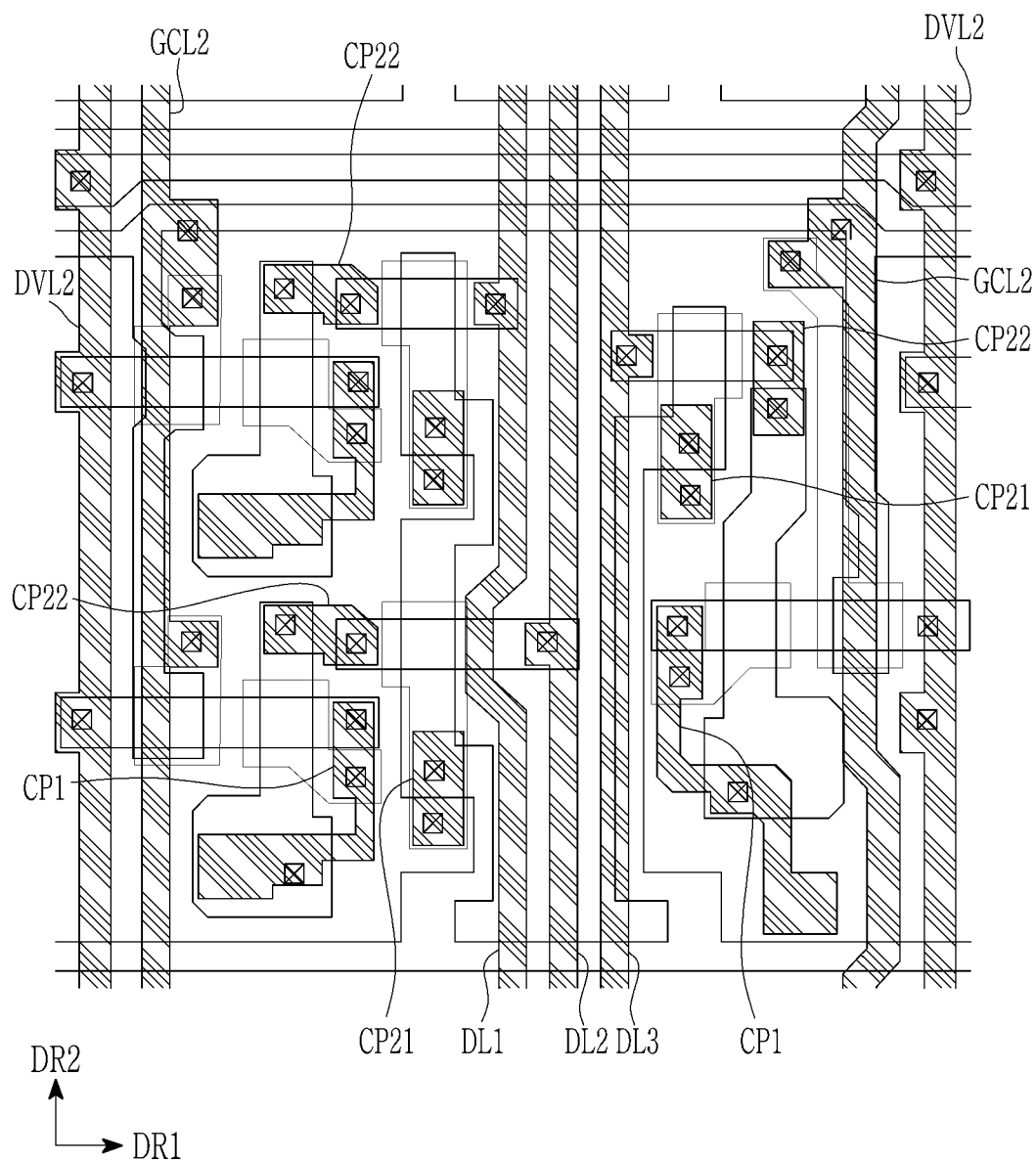

A third insulating layer IL3 may be disposed on the second conductive layer. A third conductive layer may be disposed on the third insulating layer IL3. FIG. 8 illustrates a third conductive layer.

The first conductive layer, the second conductive layer, and the third conductive layer may respectively include at least one of metals including copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. The first conductive layer, the second conductive layer, and the third conductive layer may respectively be made of a single layer or a multilayer. For example, they may respectively have a multilayered structure including a lower layer including titanium and an upper layer including copper.

The third conductive layer may include a first data line DL1, a second data line DL2, and a third data line DL3. The first data line DL1, the second data line DL2, and the third data line DL3 extend in the second direction DR2. The first data line DL1, the second data line DL2, and the third data line DL3 may have a predetermined width and may have a bar shape extending in the second direction DR2. The first data line DL1, the second data line DL2, and the third data line DL3 may be adjacently disposed in the first direction DR1 traversing the second direction DR2. The first data line DL1, the second data line DL2, and the third data line DL3 may be disposed to be spaced from each other with a predetermined gap. Different data voltages are applied to the first data line DL1, the second data line DL2, and the third data line DL3, and the lines may be disposed to be spaced from each other so that they may not be short-circuited. The first direction DR1 may be a row direction and the second direction DR2 may be a column direction. The first direction DR1 may be perpendicular to the second direction DR2. A second data line DL2 may be disposed adjacent to the right side of the first data line DL1 and a third data line DL3 may be disposed adjacent to the right side of the second data line DL2. In this instance, the expression that the data lines DL1, DL2, and DL3 are disposed adjacent to means that there is no other wire extending in parallel to the data lines DL1, DL2, and DL3 between adjacent data lines among the data lines DL1, DL2, and DL3. That is, there is no wire extending in parallel to the first data line DL1 and the second data line DL2 that are disposed adjacent to each other. Further, there is no wire between the second data line DL2 and the third data line DL3 that are disposed adjacent to each other.

The third conductive layer may further include a driving voltage line DVL2 and a global control auxiliary wire GCL2.

The driving voltage line DVL2 extends in the second direction DR2. The driving voltage line DVL2 may extend in parallel to the first to third data lines DL1, DL2, and DL3. A driving voltage (ELVDD) may be applied to the driving voltage line DVL2. The driving voltage line DVL2 may be connected to the first region P3 of the third transistor T3. The driving voltage (ELVDD) may be applied to the first region P3 of the third transistor T3. The driving voltage line DVL2 may also be electrically connected to the driving voltage auxiliary line DLV1 disposed on the second conductive layer.

The global control auxiliary wire GCL2 extends in the second direction DR2. The global control auxiliary wire GCL2 may extend in parallel to the driving voltage line DVL2. The global control auxiliary wire GCL2 may be electrically connected to the global control wire GCL1 disposed on the second conductive layer. Thus, resistance of the global control wire GCL1 may be reduced.

The third conductive layer may further include a first connection pattern CP1, a second connection pattern CP21, and a third connection pattern CP22.

The first connection pattern CP1 may overlap the first contact hole C11 and the second contact hole C12. The first contact hole C11 may overlap the second region Q1 of the first semiconductor layer ACT1. The second contact hole C12 may overlap the first metal layer BL1. The first connection pattern CP1 may electrically connect the second region Q1 of the first semiconductor layer ACT1 and the first metal layer BL1. The first connection pattern CP1 may be a drain electrode described with reference to FIG. 3A and FIG. 3B.

The second connection pattern CP21 may connect the second gate electrode GE2 of the second transistor T2 to the second metal layer BL2. The third connection pattern CP22 may overlap the second region Q2 of the second transistor T2 and the region extending from the low storage electrode (LE). The third connection pattern CP22 may electrically connect the second region Q2 of the second transistor T2 to the low storage electrode (LE) through the contact holes C22 and C23.

A fourth insulating layer IL4 may be disposed on the third conductive layer. The fourth insulating layer IL4 may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer.

As shown in FIG. 3B, a fourth conductive layer including the first electrode E1 may be disposed on the fourth insulating layer IL4. The first electrode E1 may be electrically connected to the first transistor T1 through the contact hole C14.

A fifth insulating layer IL5 may be disposed on the fourth conductive layer. The fifth insulating layer IL5 may include an organic insulating material such as a polyacryl-based resin or a polyimide-based resin. The fifth insulating layer IL5 may include an opening exposing the first electrode E1.

An emission layer (EL) may be disposed on the fifth insulating layer IL5 and the first electrode E1. The emission layer (EL) may be disposed in the opening of the fifth insulating layer IL5. The emission layer (EL) may include an organic light emitting material or an inorganic light emitting material. The emission layer (EL) is shown to be formed on the substrate (SUB) to correspond to each pixel but the formation of the emission layer (EL) is not limited thereto. The emission layer (EL) may be disposed to overlap the plurality of pixels. For example, one emission layer (EL) is formed to entirely cover the plurality of pixels in the display area DA.

A second electrode E2 may be disposed on the emission layer (EL). The second electrode E2 may be entirely disposed on the substrate (SUB). That is, one second electrode E2 may be disposed on a plurality of pixels PX1, PX2, and PX3. The common voltage (ELVSS) may be applied to the second electrode E2.

At least one of the fourth conductive layer and the second electrode E2 may be made of a transparent metal oxide such as an indium tin oxide (ITO) or an indium zinc oxide (IZO).

The first electrode E1, the emission layer (EL), and the second electrode E2 of the respective pixels PX1, PX2, and PX3 may constitute a light emitting diode (ED). In this instance, the first electrode E1 may be an anode and the second electrode E2 may be a cathode.

A method for manufacturing a display device according to an embodiment will now be described with reference to FIG. 9 to FIG. 19. FIG. 9, FIG. 10, FIG. 11, FIG. 12, FIG. 13, FIG. 14, FIG. 15, FIG. 16, FIG. 17, FIG. 18, and FIG. 19 show cross-sectional views of a display panel for a manufacturing process according to an embodiment. The same constituent elements as the above-described constituent elements will be omitted for brevity.

Figure 9:
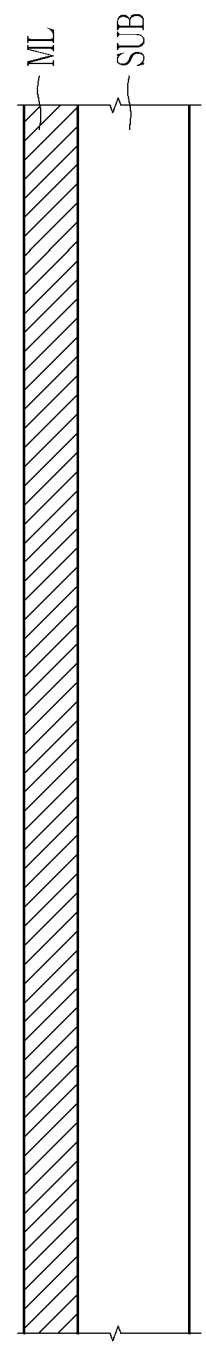
FIG. 9, FIG. 10, FIG. 11, FIG. 12, FIG. 13, FIG. 14, FIG. 15, FIG. 16, FIG. 17, FIG. 18, and FIG. 19 show cross-sectional views of a display panel for a manufacturing process according to an embodiment.

Referring to FIG. 9, a first metal material layer (ML) is formed on the substrate (SUB). The first metal material layer (ML) may, for example, include molybdenum (Mo), aluminum (Al), copper (Cu) silver (Ag), chromium (Cr), tantalum (Ta), and titanium (Ti), and is not limited thereto. The first metal material layer (ML) may include a single or multi-layered structure.

Figure 10:
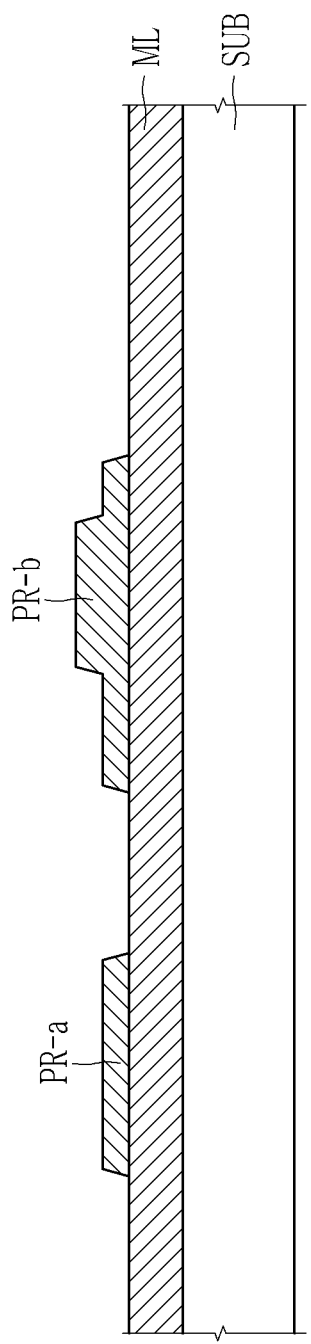

As shown in FIG. 10, photoresist patterns (PR-a and PR-b) are formed on the first metal material layer (ML). The photoresist patterns (PR-a and PR-b) may be formed by using a halftone mask. The first photoresist pattern (PR-a) and the second photoresist pattern (PR-b) with different thicknesses may be formed using the halftone mask at the same time. The second photoresist pattern (PR-b) may be thicker than the first photoresist pattern (PR-a). The first photoresist pattern (PR-a) and the second photoresist pattern (PR-b) may be integrally formed and may be altered according to the shape of the first metal layer needed.

Figure 11:
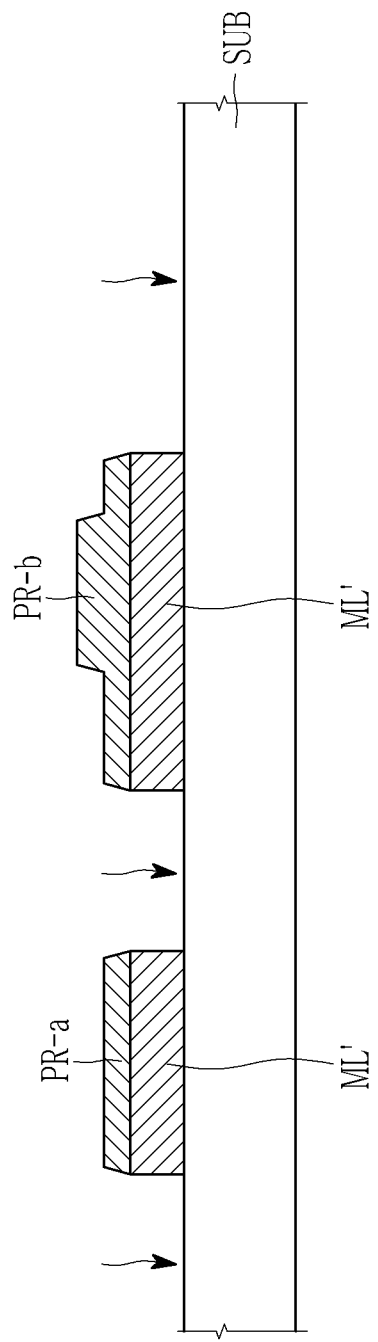

As shown in FIG. 11, a first metal material layer pattern (ML') is formed by etching the first metal material layer ML using the first photoresist pattern (PR-a) and the second photoresist pattern (PR-b) as masks. The first metal material layer pattern (ML') overlapping the first photoresist pattern (PR-a) and the second photoresist pattern (PR-b) may be protected from etching and the first metal material layer ML not covered by the first photoresist pattern (PR-a) and the second photoresist pattern (PR-b) may be selectively removed.

Figure 12:
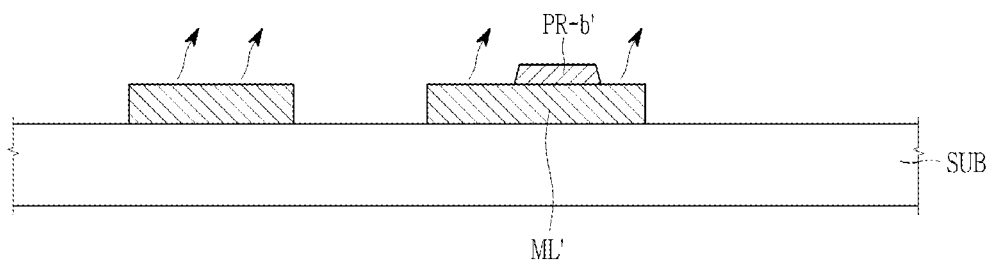

The first photoresist pattern (PR-a) and a thinner portion of the second photoresist pattern (PR-b) is completely removed by an ashing process. As shown in FIG. 12, part of the second photoresist pattern (PR-b') remains. The first metal material layer pattern (ML') is etched using the part of the second photoresist pattern (PR-b') as a mask.

Figure 13:
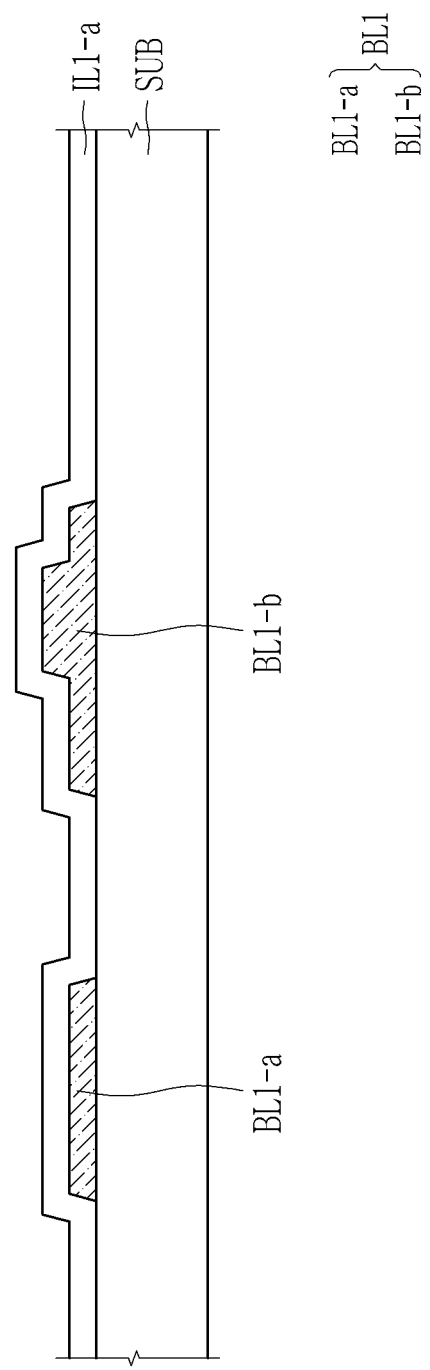

According to this, as shown in FIG. 13, first metal layers (BL1-a and BL1-b) with different thicknesses may be formed. The first metal layer BL1 may include a first portion (BL1-a) and a second portion (BL1-b) with different thicknesses. The second portion (BL1-b) may be thicker than the first portion (BL1-a).

A first insulating material layer (IL1-a) is formed on the first metal layers (BL1-a and BL1-b). The first insulating material layer (IL1-a) may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer.

The first insulating material layer (IL1-a) may be formed by the deposition process. The first insulating material layer (IL1-a) may overlap the front surface of the substrate (SUB). The first insulating material layer (IL1-a) may overlap the substrate (SUB) and the first metal layer (BL1-a, BL1-b). The first insulating material layer (IL1-a) may have a thickness greater than a difference in thickness between the a first portion (BL1-a) and a second portion (BL1-b) of the first metal layer BL1. Particularly, the first insulating material layer (IL1-a) overlapping the second portion (BL1-b) may further protrude in the third direction DR3 than the other portions of the first insulating material layer (IL1-a).

Figure 14:
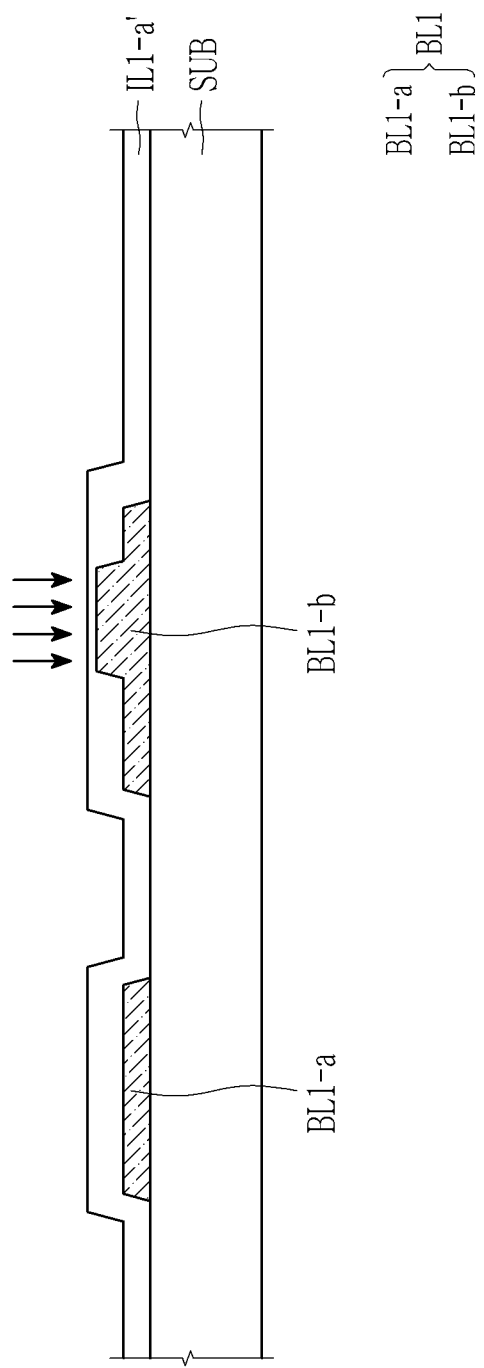

As shown in FIG. 14, a polishing process is performed on the part of the first insulating material layer in the second portion (BL1-b). By the polishing process, the first insulating material layer (IL1-a') from which the protrusion is removed may be formed. The upper side of the first insulating material layer (IL1-a') overlapping the second portion (BL1-b) may be formed to have substantially the same level as the first insulating material layer (IL1-a') overlapping the first portion (BL1-a). The first insulating material layer (IL1-a') may cover the upper surface of the second portion (BL1-b) and the first insulating material layer (IL1-a') covering the upper surface of the second portion (BL1-b) may be substantially very thin.

Figure 15:
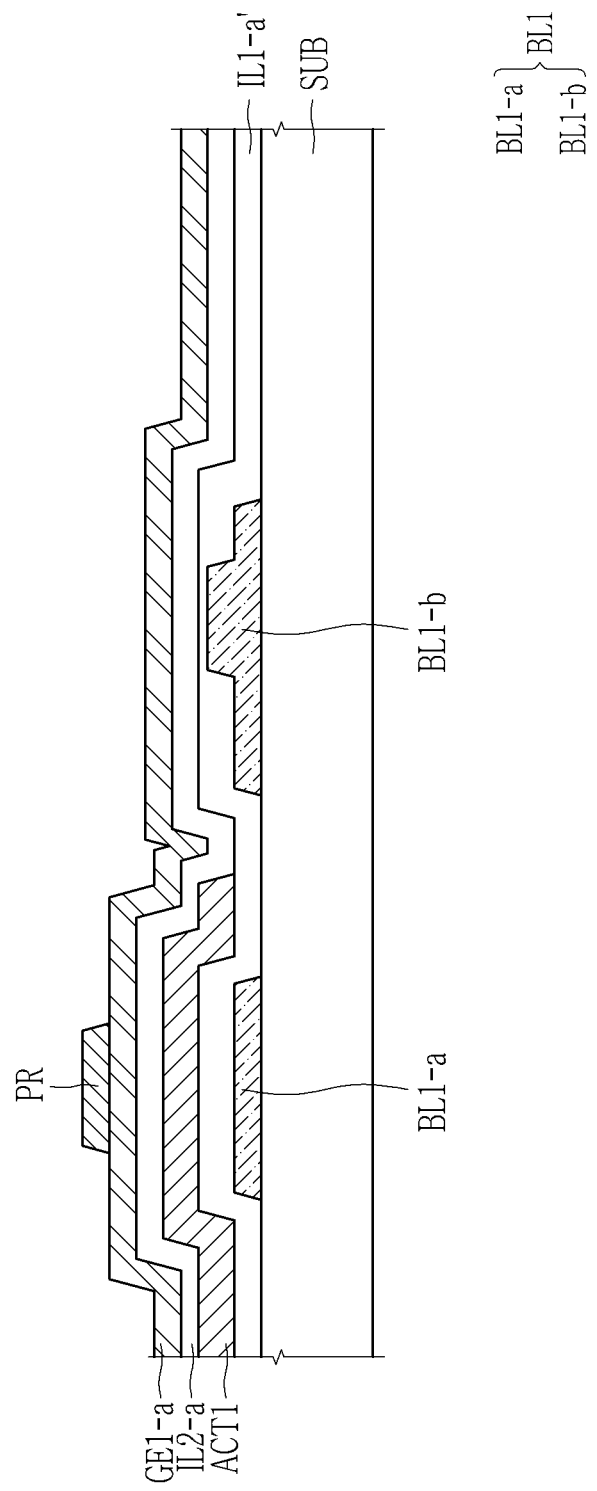

As shown in FIG. 15, a semiconductor layer ACT1 is formed on the first insulating material layer (IL1-a'). A second insulating material layer (IL2-a) and a gate electrode material layer (GE1-a) overlapping the front surface of the substrate (SUB) may be formed on the semiconductor layer ACT1 and the first insulating material layer (IL1-a'). A photoresist pattern (PR) for forming a gate electrode and a second insulating layer is formed on the gate electrode material layer (GE1-a).

Figure 16:
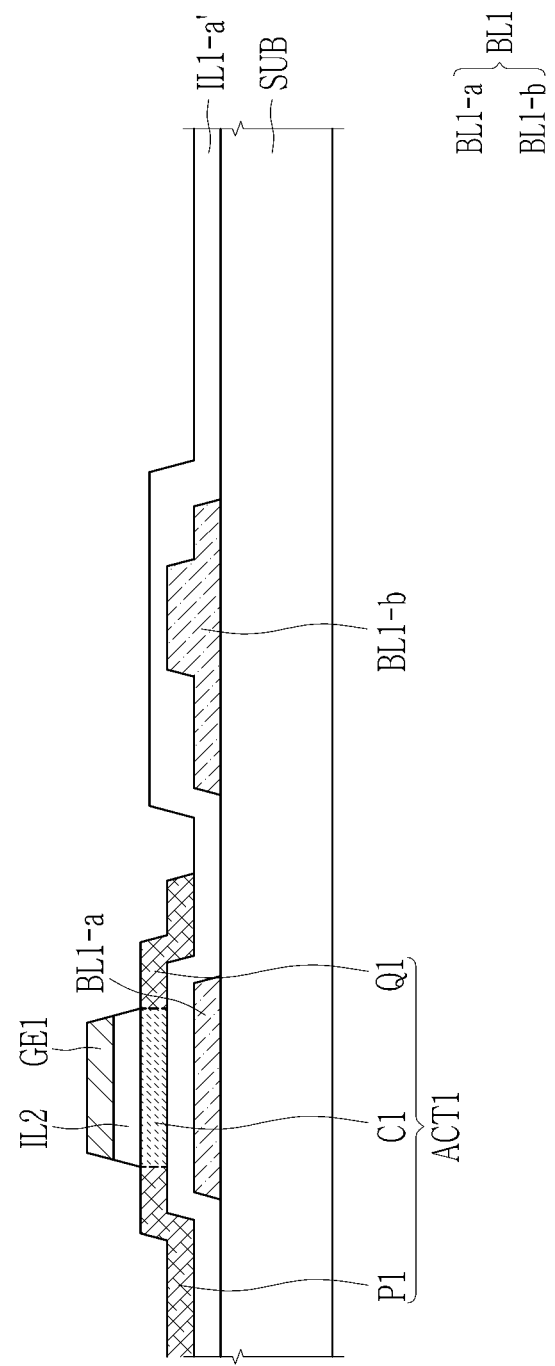

As shown in FIG. 16, a gate electrode material layer (GE1-a) and a second insulating material layer (IL2-a) are etched with the photoresist pattern (PR) as a mask to form a second insulating layer IL2 and a gate electrode GE1 sequentially disposed on the semiconductor layer ACT1. The edges of the second insulating layer IL2 and the gate electrode GE1 may be aligned with each other. The edge of the second insulating layer IL2 may completely surround the edge of the gate electrode GE1.

Figure 17:
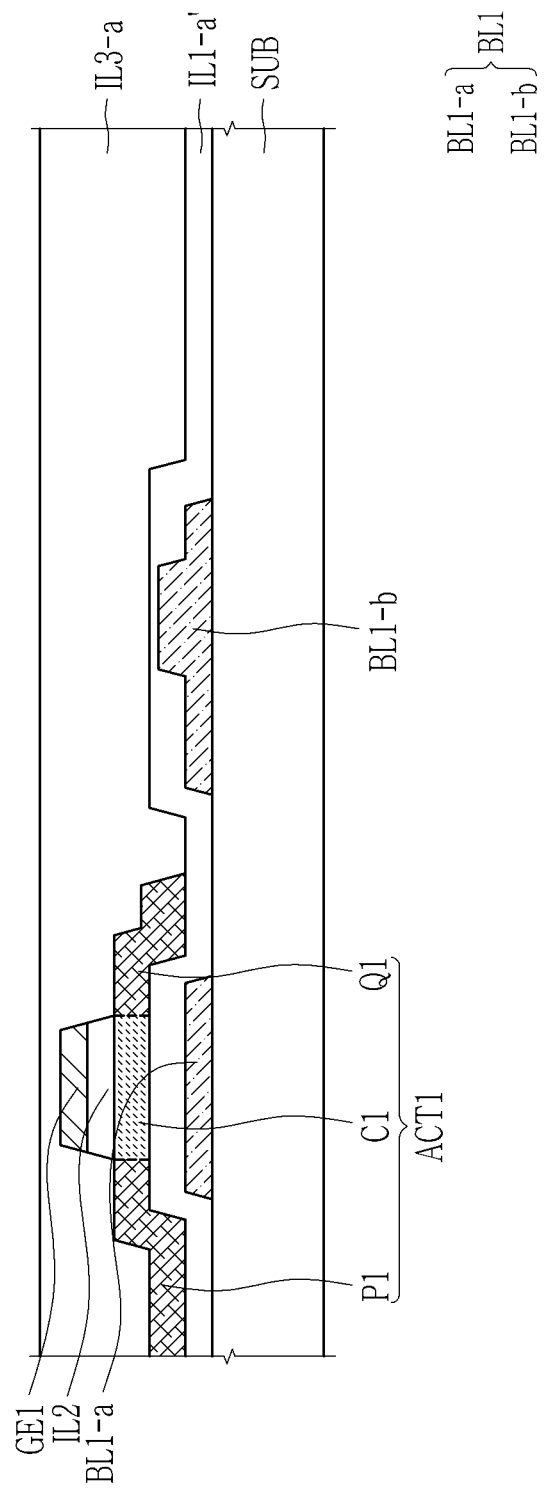

As shown in FIG. 17, a third insulating material layer (IL3-a) is formed on the gate electrode GE1, the semiconductor layer ACT1, and the first insulating layer IL1-a'. The third insulating material layer (IL3-a) may cover the front surface of the substrate (SUB).

The third insulating material layer (IL3-a) may include an inorganic insulating material such as a silicon nitride (SiNx), a silicon oxide (SiOx), or a silicon oxynitride (SiON), and/or an organic insulating material such as a polyimide, an acryl-based polymer, or a siloxane-based polymer.

Figure 18:
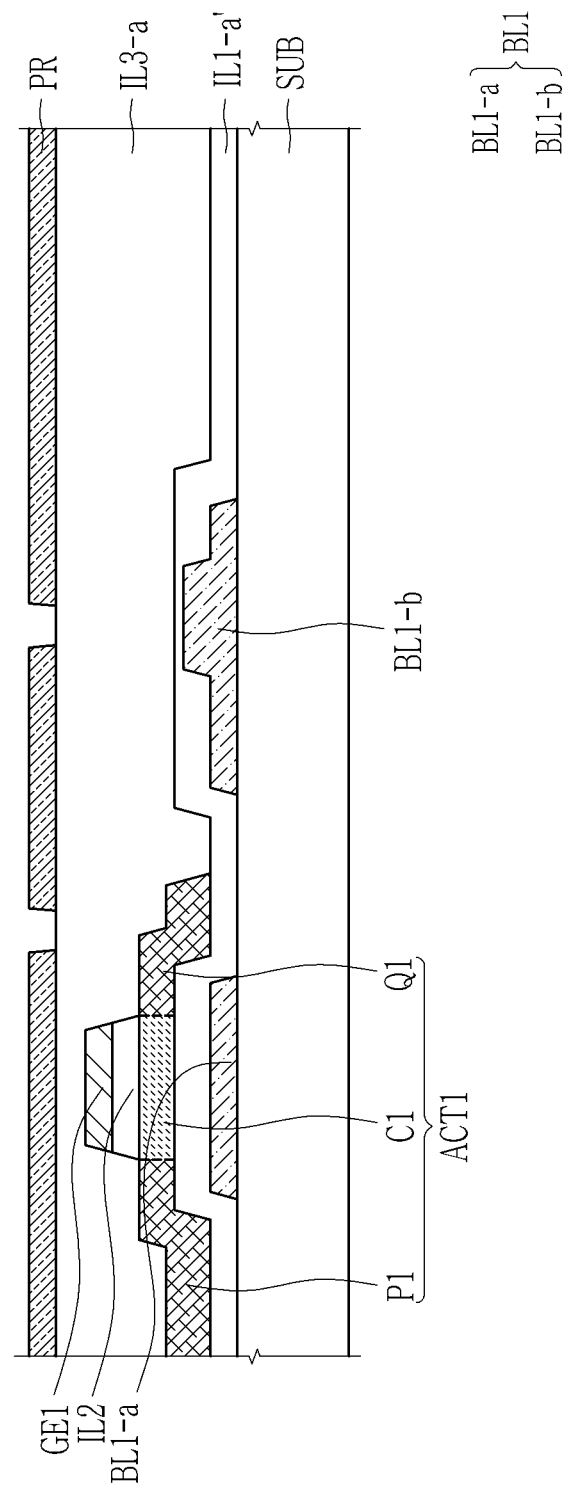

As shown in FIG. 18, a photoresist pattern (PR) is formed on the third insulating material layer (IL3-a). The photoresist pattern (PR) is used to form a contact hole. Part of the third insulating material layer (IL3-a) may be removed using the photoresist pattern (PR) as a mask.

Figure 19:
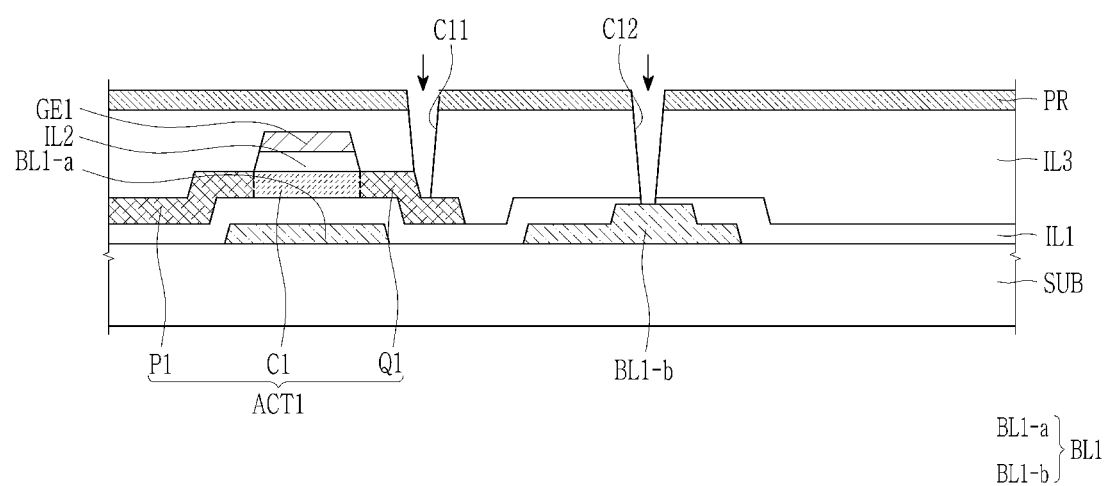

As shown in FIG. 19, a first contact hole C11 and a second contact hole C12 may be formed using the photoresist pattern (PR) as a mask. The first contact hole C11 may expose the second region Q1 of the semiconductor layer ACT1. The second contact hole C12 may extend to the first insulating layer IL1 as well as the third insulating layer IL3. The second contact hole C12 may expose the second portion (BL1-b) of the first metal layer.

Contact holes C11 and C12 formed through the third insulating layer IL3 and the first insulating layer IL1 may be formed by using the same mask. In this instance, the first insulating layer IL1 overlapping the second portion (BL1-b) may be very thin.

A height of the first contact hole C11 may be a thickness of the third insulating layer IL3 disposed on the first semiconductor layer ACT1. A height of the second contact hole C12 may be a sum of thicknesses of the third insulating layer IL3 and the first insulating layer IL1 disposed on the second portion (BL1-b) of the first metal layer BL1. A height difference between the first contact hole C11 and the second contact hole C12 may be a sum of the thicknesses of the semiconductor layer ACT1 and the first insulating layer IL1 overlapping the second portion of the first metal layer BL1 (BL1-b). The thickness of the semiconductor layer ACT1 is about 300 angstroms to about 500 angstroms, and the first insulating layer IL1 overlapping the second portion (BL1-b) may be very thin. A height difference between the first contact hole C11 and the second contact hole C12 may be substantially equal to the thickness of the semiconductor layer ACT1. A height difference between the first contact hole C11 and the second contact hole C12 may be about 300 angstroms to about 500 angstroms. That is, the height difference may be very small. Because the height difference between the first contact hole C11 and the second contact hole C12 is reduced by forming the second portion of the first metal layer BL1 (BL1-b) which is thicker than other portions of the first metal layer BL1 and reducing a thickness of the first insulating layer formed on the second portion of the first metal layer BL1 (BL1-b), damage to the semiconductor layer ACT1 may be reduced when forming the first contact hole C11 and the second contact hole C12.

Further, the second contact hole C12 are formed in the first insulating layer IL1 and the third insulating layer IL3 using one mask, the manufacturing process is simple and the cost and time for the process may be reduced.

After forming the first contact hole C11 and the second contact hole, the photoresist pattern is removed, and a source electrode (SE) and a drain electrode may be formed on the third insulating layer IL3. A fourth insulating layer IL4 may be formed on the source electrode (SE), the drain electrode, and the third insulating layer IL3. The light-emitting device (ED) may be formed by sequentially forming the first electrode E1 electrically connected to the drain electrode, the emission layer (EL), and the second electrode E2.

While this inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
    a first metal layer disposed on a substrate;
    a first insulating layer disposed on the first metal layer;
    a first transistor disposed on the first insulating layer, the first transistor including a semiconductor layer; and
    a light-emitting device electrically connected to the first transistor,
    wherein the first metal layer includes:
    a first portion overlapped with the semiconductor layer in a plan view and having a first thickness, and
    a second portion not overlapped with the semiconductor layer in the plan view and having a first region having the first thickness and a second region having a second thickness thicker than the first thickness, the first region protruding from an edge of the second region in a direction away from the second region, and
    wherein the semiconductor layer is electrically connected to the first metal layer and the first region and the second region comprise a same material.

2. The display device of claim 1, wherein the first transistor further includes a gate electrode disposed on the semiconductor layer and a source electrode and a drain electrode disposed on the gate electrode.

3. The display device of claim 2, wherein the display device further includes a second insulating layer disposed between the semiconductor layer and the gate electrode and a third insulating layer disposed between the gate electrode and the source electrode and between the gate electrode and the drain electrode.

4. The display device of claim 3, wherein the semiconductor layer includes a first region electrically connected to the source electrode and a second region electrically connected to the drain electrode, and the third insulating layer includes a first contact hole exposing the second region of the semiconductor layer and a second contact hole exposing the second portion of the first metal layer.

5. The display device of claim 4, wherein the second contact hole extends to the first insulating layer.

6. The display device of claim 5, wherein the drain electrode is connected to the second region of the semiconductor layer through the first contact hole and is connected to the second portion of the first metal layer through the second contact hole.

7. The display device of claim 3, wherein the first insulating layer includes a first portion overlapping the first portion of the first metal layer and a second portion overlapping the second portion of the first metal layer and the second portion of the first insulating layer is thinner than the first portion of the first insulating layer.

8. The display device of claim 3, wherein edges of the second insulating layer and the gate electrode are aligned.

9. The display device of claim 1, wherein the display device further includes a second transistor and a third transistor electrically connected to the first transistor.

10. The display device of claim 1, wherein a thickness of the semiconductor layer is about 300 angstroms to about 500 angstroms.

11. The display device of claim 1, wherein a thickness of the first insulating layer is about 2000 angstroms to about 4000 angstroms.

12. A method for manufacturing a display device, comprising:
    forming a first metal material layer on a substrate;
    forming a first metal layer including a first portion and a second portion with different thicknesses by etching the first metal material layer using a halftone mask;
    forming a first insulating material layer on the first metal layer;
    removing a protruding part of the first insulating material layer by using a polishing process;
    forming a semiconductor layer, a second insulating layer, and a gate electrode on the first insulating material layer;
    forming a third insulating material layer on the gate electrode;
    forming a third insulating layer having a first contact hole exposing the semiconductor layer and a second contact hole exposing the second portion of the first metal layer by etching the third insulating material layer using a mask; and
    forming a source electrode and a drain electrode on the third insulating layer.

13. The method of claim 12, wherein the second portion of the first metal layer is formed to be thicker than the first portion of the first metal layer.

14. The method of claim 13, wherein the first insulating material layer overlapping the second portion of the first metal layer has the protruding part and an upper side of the second portion of the first metal layer is covered by the first insulating material layer in the polishing process for removing the protruding part.

15. The method of claim 12, wherein edges of the second insulating layer and the gate electrode are formed to be aligned with each other.

16. The method of claim 12, wherein the semiconductor layer includes a first region, a second region, and a channel disposed between the first region and the second region,
    wherein the first contact hole exposes the second region of the semiconductor layer and
    wherein the first contact hole and the second contact hole are formed in a same process.

17. The method of claim 16, wherein the second contact hole is formed in the third insulating layer and the first insulating layer.

18. The method of claim 17, wherein the drain electrode directly contacts the second portion of the first metal layer.

19. The method of claim 17, wherein the drain electrode is connected to the second region of the semiconductor layer through the first contact hole and is connected to the second portion of the first metal layer through the second contact hole.

\* \* \* \* \*